United States Patent
Roohparvar

(10) Patent No.: US 7,145,800 B2
(45) Date of Patent: *Dec. 5, 2006

(54) PRECONDITIONING OF DEFECTIVE AND REDUNDANT COLUMNS IN A MEMORY DEVICE

(75) Inventor: Frankie F. Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/255,646

(22) Filed: Oct. 21, 2005

(65) Prior Publication Data

US 2006/0034126 A1 Feb. 16, 2006

Related U.S. Application Data

(63) Continuation of application No. 10/301,410, filed on Nov. 21, 2002, now Pat. No. 6,977,841.

(51) Int. Cl.
G11C 16/00 (2006.01)

(52) U.S. Cl. ............... 365/185.09; 365/185.11; 365/185.22; 365/185.24; 365/185.29; 365/185.33; 365/200; 711/104

(58) Field of Classification Search ............ 711/104; 365/185.09, 185.11, 185.22, 185.24, 185.29, 365/185.33, 189.09, 200
See application file for complete search history.

(56) References Cited

U.S. PATENT DOCUMENTS

| | | | |
|---|---|---|---|
| 4,999,812 | A | 3/1991 | Amin |
| 5,237,535 | A | 8/1993 | Mielke et al. |
| 5,594,689 | A | 1/1997 | Kato |
| 5,774,396 | A | 6/1998 | Lee |
| 6,198,662 | B1 | 3/2001 | Chen |
| 6,249,459 | B1 | 6/2001 | Chen |
| 6,279,070 | B1 | 8/2001 | Jeong et al. |
| 6,381,174 | B1 | 4/2002 | Roohparvar et al. |
| 6,407,947 | B1 | 6/2002 | Ahn |
| 6,469,932 | B1 | 10/2002 | Roohparvar |

Primary Examiner—Matthew Kim
Assistant Examiner—Hetul Patel
(74) Attorney, Agent, or Firm—Leffert Jay & Polglaze, P.A.

(57) ABSTRACT

A redundant column is mapped to a defective or over-erased column in the memory array. When an erase command occurs, both the redundant column and the defective or over-erased column are preconditioned by preprogramming them. The defective or over-erased column is preprogrammed and verified a predetermined number of times or until the verification passes. The redundant and defective or over-erased columns are then erased with the rest of the memory block.

20 Claims, 4 Drawing Sheets

PRECONDITIONING OF DEFECTIVE AND REDUNDANT COLUMNS IN A MEMORY DEVICE

RELATED APPLICATIONS

This application is a Continuation of U.S. patent application Ser. No. 10/301,410 (allowed), filed Nov. 21, 2002 now U.S. Pat. No. 6,977,841 and titled, "PRECONDITIONING OF DEFECTIVE AND REDUNDANT COLUMNS IN A MEMORY DEVICE", each of which is commonly assigned and incorporated by reference herein in their entirety.

BACKGROUND OF THE INVENTION

I. Field of the Invention

The present invention relates generally to memory devices and particularly to flash memory devices.

II. Description of the Related Art

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices.

A synchronous flash memory device is a flash memory device that has a synchronous dynamic random access memory (SDRAM) interface. This enables the synchronous flash device to operate at much higher speeds than a typical flash memory.

An erase operation in flash memory is typically comprised of three separate activities. The entire array is pre-programmed, the memory block is erased, and a $V_t$ tightening operation is performed.

The array is pre-programmed in order to reduce the chances of the cells going into a depletion mode. As the cells in a flash memory device get erased, they may get erased to the point where they go into depletion and conduct current even when those cells have a gate voltage of 0 V. This affects the reading of all other cells in their respective columns. By pre-programming the memory, the cells start from a known programmed state and are therefore less likely to go into depletion.

The erase operation is then conducted to ensure that all cells are erased to at least a minimum level. At the end of the erase operation, there is no guarantee that some cells have not been over-erased. In this case, a $V_t$ tightening operation is performed.

The $V_t$ tightening operation is a short programming pulse that is intended to pull memory cells that are depleted back into the normal population of erased cells. $V_t$ is the gate voltage to which the memory cell is programmed. This operation may be accomplished by pulsing the cell, then checking for the erased state. This operation is repeated until all depleted cells are left with proper threshold voltages.

Most flash memory devices are read in a byte or word mode. In this case, the interaction between bit lines (also referred to in the art as columns or data lines) is not an issue since only 8 or 16 out of 2000 or 4000 columns, for example, are being sensed at any one time. However, in synchronous flash memory devices, 8000 bit lines may be sensed at a time. This makes the interaction between adjacent bit lines an important part of the read operation.

If an adjacent bit line is defective or over-erased, it pulls down at a faster rate than a normal bit line. The coupling capacitance between the two bit lines shows up as an AC injected current in the adjacent bit line. This current is going to make the cells in that adjacent bit line appear as erased when they may actually be programmed.

In a synchronous flash device, the defective bit lines do not get preprogrammed and are therefore continually erased until they go into an over-erasure condition. These bit lines then discharge even more quickly thus causing greater problems with adjacent bit lines.

An additional problem is that typical preprogram operations may try to verify the preprogrammed data up to one thousand times. This increases the test time and the time it takes to do any erase operation. There is a resulting need in the art for a way to reduce or eliminate the effect that defective or over-erased bit lines have on adjacent bit lines while also reducing the time required to perform a preprogram operation.

SUMMARY

The present invention encompasses a method for preconditioning a memory device having at least one redundant column corresponding to a defective or over-erased memory array column. The method preprograms the redundant column and the defective/over-erased memory array column. The erase operation is then performed on the memory array including the redundant and primary columns.

In one embodiment, a defective primary column to which the redundant column is mapped goes through a preprogram verification operation. This operation attempts to verify that the column has been preprogrammed and is performed for a predetermined number of attempts. For example, the memory array column may go through four attempts at verification.

DETAILED DESCRIPTION

The embodiments of the memory device of the present invention enable the memory device to have defective columns without affecting the operation of the memory device. This is especially relevant if the memory device is a synchronous flash memory device that performs thousands of simultaneous read operations in which adjacent columns may be affected by a defective or over-erased column. Preprogramming both the redundant column and the defective or over-erased primary column facilitates reducing or eliminating these effects.

While the subsequent discussion of the embodiments of the present invention refers to synchronous flash memory, any type of memory device that has similar characteristics may be used. For example flash memory, non-volatile RAM (NOVRAM), or electrically erasable programmable read only memory (EEPROM) may be encompassed by the present invention.

Figure 1:
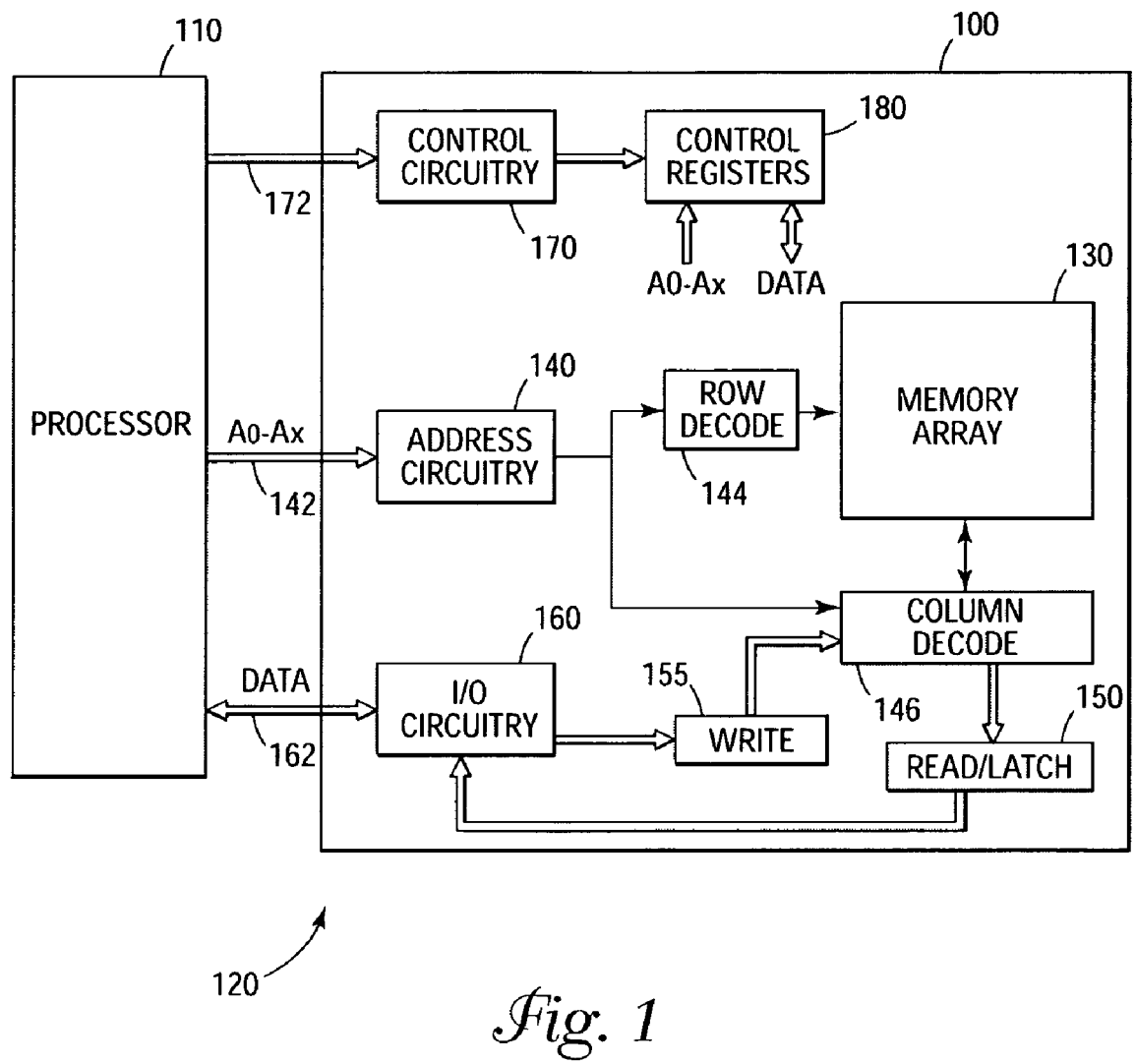
FIG. 1 shows a block diagram of one embodiment of an electronic system of the present invention.

FIG. 1 is a functional block diagram of one embodiment of a memory device (100) of the present invention. The memory device (100) may be coupled to a processor (110) to form part of an electronic system (120). The memory device (100) has been simplified to focus on features of the memory that are helpful in understanding the present invention. In one embodiment, the memory device is a synchronous flash memory device.

The memory device includes an array of memory cells (130). The memory cells are non-volatile floating-gate memory cells and the memory array (130) is arranged in banks of rows and columns. In one embodiment, the array of memory cells is comprised of a block of memory that makes up a predetermined address range in the memory array.

An address buffer circuit (140) is provided to latch address signals provided on address input connections AO–Ax (142). Address signals are received and decoded by a row decoder (144) and a column decoder (146) to access the memory array (130). It will be appreciated by those skilled in the art, with the benefit of the present description, that the number of address input connections depends on the density and architecture of the memory array (130). That is, the number of addresses increases with both increased memory cell counts and increased bank and block counts.

The memory device (100) reads data in the memory array (130) using sense amplifiers to sense voltage or current changes in the memory array columns using read/latch circuitry (150). The read/latch circuitry (150), in one embodiment, is coupled to read and latch a row of data from the memory array (130). Data input and output buffer circuitry (160) is included for bi-directional data communication over a plurality of data (DQ) connections (162) with the processor (110). Write circuitry (155) is provided to write data to the memory array.

Command control circuit (170) decodes signals provided on control connections (172) from the processor (110). These signals are used to control the operations on the memory array (130), including data read, data write, and erase operations. In one embodiment, the control circuitry (170) is comprised of a state machine that executes the control functions of the memory device (100).

An array of control registers (180) store the commands and the control data. Some of the control registers are used for typical control functions and others are reserved for expansion and/or future use.

The flash memory device illustrated in FIG. 1 has been simplified to facilitate a basic understanding of the features of the memory as they relate to the present invention. A more detailed understanding of internal circuitry and functions of flash memories and synchronous flash memories are known to those skilled in the art.

Figure 2:
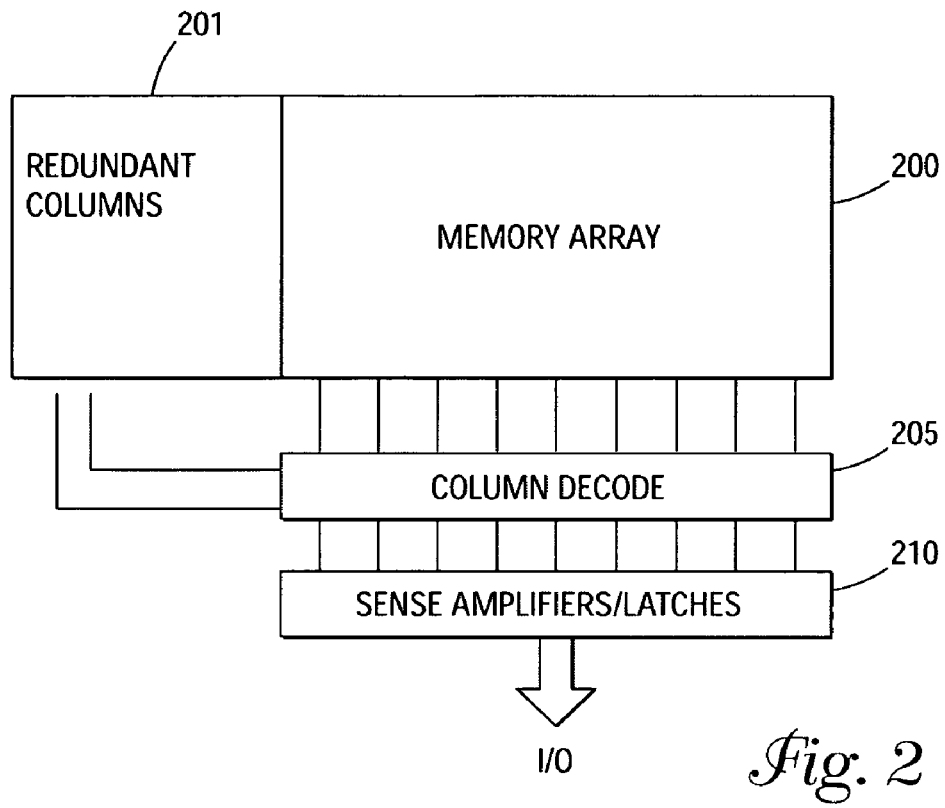
FIG. 2 shows a block diagram of one embodiment of a memory device of the present invention.

FIG. 2 illustrates a block diagram of one embodiment of a more detailed view of the memory device of the present invention as illustrated in FIG. 1. In one embodiment, the memory device is a synchronous flash memory device. Alternate embodiments use other types of memory.

The memory device is comprised of a memory array (200), as described above, that has the primary columns. The memory array is coupled to the column decode circuitry (205) as described above. A plurality of sense amplifiers and latches (210) that are responsible for reading the state of the columns of the memory array (200) are coupled to the output of the column decode circuitry (205). The outputs of the sense amplifiers/latches (205) go to I/O circuitry and the DQ outputs of the memory device.

The memory device additionally has a redundant column area (201) that is coupled to the column decode circuitry (205). The redundant column area (201) provides the redundant columns for any defective primary columns when a particular column in the memory array (200) is defective. Once a primary column in the memory array (200) is found to be defective, a redundant column from the redundant column area (201) is mapped to the defective primary column by the control circuitry of the memory device. This mapping function, in one embodiment, is executed by the memory device state machine and is well known in the art.

Figure 3:
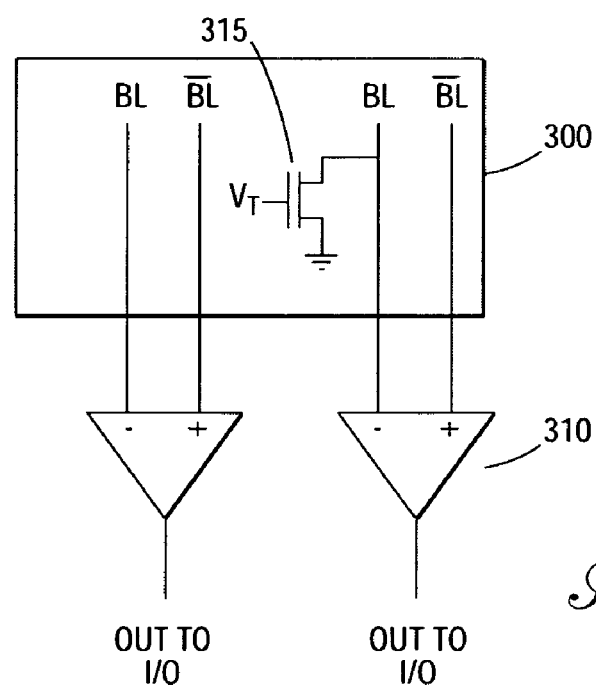
FIG. 3 shows a block diagram of one embodiment of a memory cell in a synchronous flash memory device of the present invention.

FIG. 3 illustrates a more detailed schematic diagram of the memory array and sense amplifiers of FIG. 2. The memory array (300) and redundant column area are comprised of a plurality of bit line and bit line* (BL and BL*) sense lines that form the columns of the memory array (300). Each bit line is coupled to a large number of memory cells (315) that form the memory array. FIG. 3 shows only one such memory cell for purposes of illustration. A typical memory array of the present invention may be comprised of millions of these cells. For purposes of clarity, the row decode lines are also not shown but are assumed to be there to access a particular cell.

When each cell is charged, that cell represents a logic zero and the bit line to which it is attached no longer conducts. Conversely, when the cell is not charged it represents a logic one and the bit line to which it is attached conducts. The sense amplifier (310) senses the difference in voltage between the bit line (BL) and its reference bit line (BL*).

If one of the bit lines is defective or a cell on the bit line is over-erased, that will cause the voltage on that bit line to fall faster relative to the adjacent bit lines. This will show up as an extra coupling current in the adjacent columns. Even after the defective or over-erased column is replaced by a redundant column from the redundant column area illustrated in FIG. 2, the defective or over-erased column still has an effect on adjacent columns.

Figure 4:
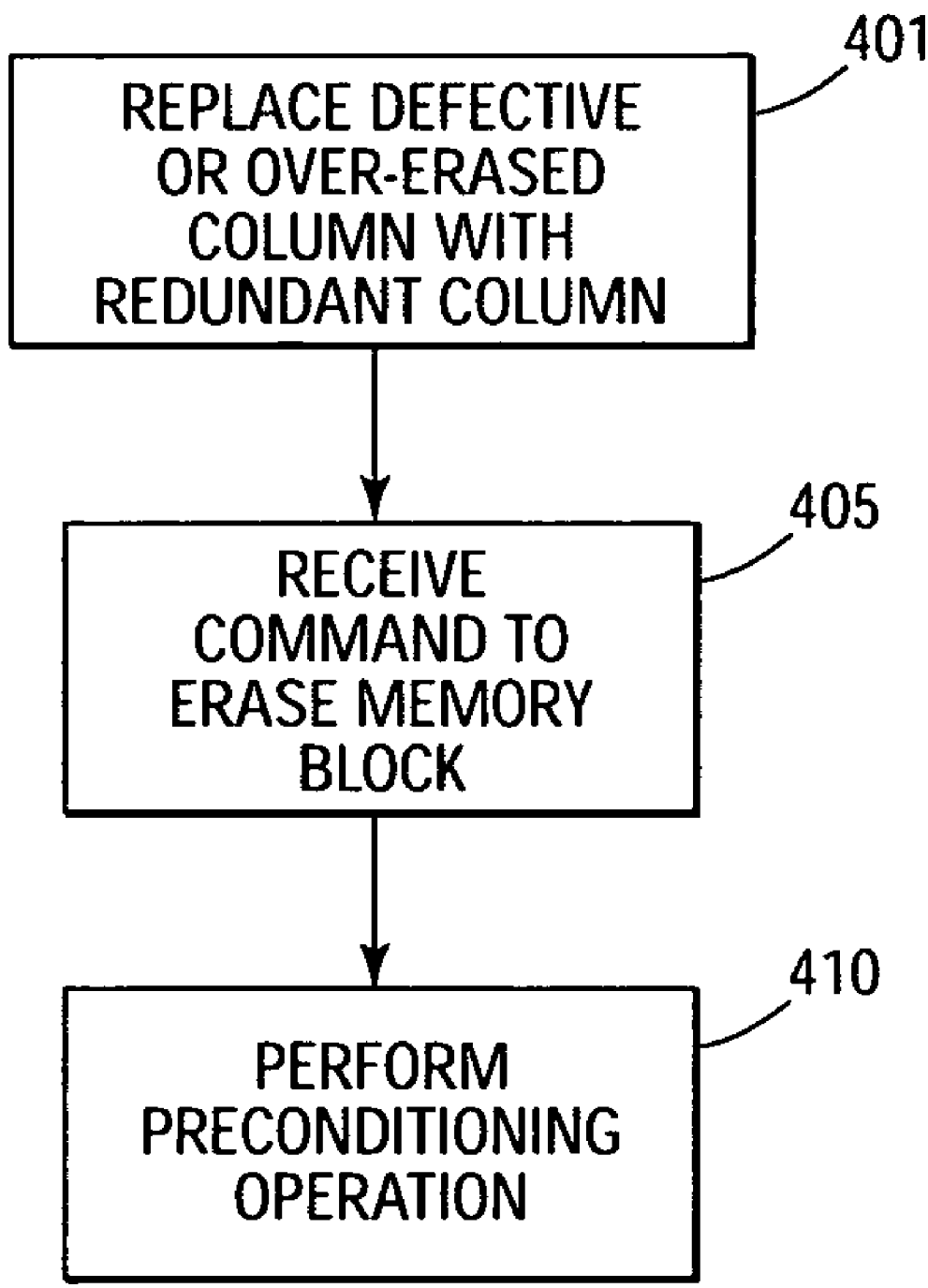
FIG. 4 shows a flowchart of one embodiment of an erase method of the present invention.

FIG. 4 illustrates a flowchart of one embodiment of an erase method of the present invention. This method, in one embodiment, is executed by the memory device's controller/state machine.

The memory device determines that a column is defective or has been over-erased. This column is replaced with a redundant column from the redundant column area (401). The method for determining when a column is defective is well known by those skilled in the art and is not discussed further.

The memory device receives a command from a processor or other device to perform an erase operation on a block of memory (405). In response to the command, the memory device's controller performs the preconditioning method (410) of FIG. 5 as well as the erase function.

Figure 5:
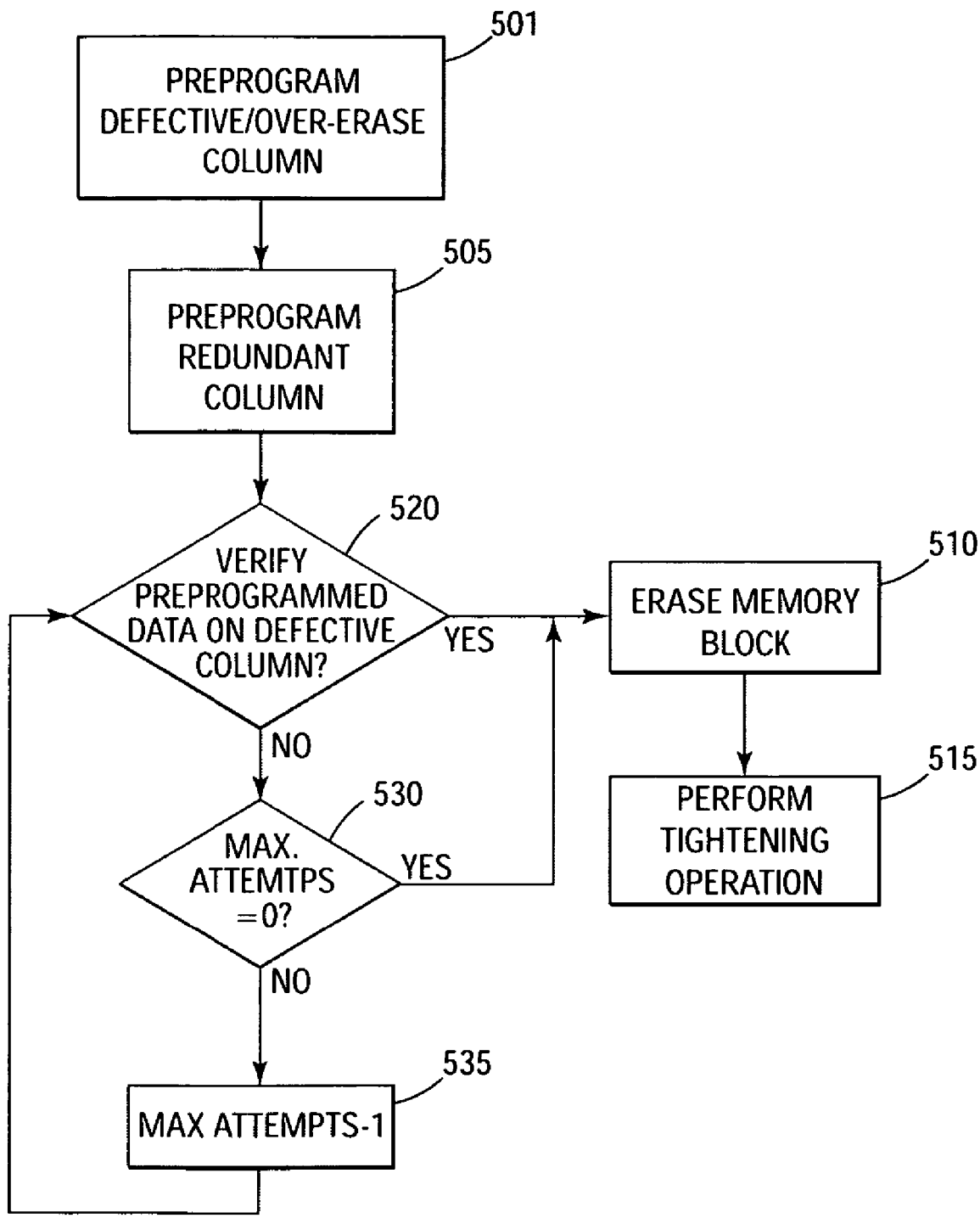
FIG. 5 shows a flowchart of one embodiment of a memory preconditioning method of the present invention.

FIG. 5 illustrates a flowchart of one embodiment of a memory preconditioning method of the present invention. This method, in one embodiment is executed by the memory device's controller/state machine. The method preprograms both the defective or over-erased column as well as the redundant column. This prevents the defective/over-erased column from becoming too over-erased such that it goes into a depletion mode. In one embodiment, the columns are preprogrammed with a logical zero.

The method preprograms the defective/over-erased column (501). This step is accomplished, in one embodiment, by selecting that column and preprogramming the cells in the column. The redundant column is also preprogrammed (505). These steps are in addition to preprogramming the remainder of the non-defective columns in the memory block selected to be erased.

After the initial pulse, the defective/over-erased column is checked to determine if the preprogrammed data is present (520). If the data is present, the method performs the normal erase function (510). If the data is not present, the counter that tracks the maximum number of attempts is checked (530).

If the defective/over-erased column has been checked the maximum number of times, the method performs the normal erase function (510). If the maximum number of access attempts has not been performed, the counter is reduced by one (535) and the column is accessed again to determine whether the cells have been preprogrammed (520). This checking of the defective/over-erased column continues until the counter reaches zero or some other predetermined quantity. In another embodiment, the counter is incremented to a predetermined quantity.

The verification of the preprogramming of the defective/over-erased column is only performed a small quantity of times. In one embodiment, the verification is performed four times. In an alternate embodiment, the verification is performed in a range of attempts that is less than ten. The present invention is not limited to any one quantity of preprogramming verification attempts. This is an improvement over the prior art preprogramming verification of non-defective columns that may require one thousand attempts.

The memory block is erased (510) after the maximum attempts counter reaches zero or some other predetermined quantity. The erase operation modifies each cell's contents such that a logical one is programmed into the cell. The erase operation is well known in the art and is not discussed further.

The $V_t$ tightening operation is performed, as is typical in flash memory devices, in order to pull memory cells that are marginal back into the erase state. As discussed above, during this operation, the cells are pulsed and checked repeatedly.

In summary, the embodiments of the present invention provide a preconditioning operation that preprograms the defective column as well as the redundant column of a memory device. If the column is found to be defective, the method only attempts to verify the preprogrammed data on the column cells a limited quantity of times, such as four, instead of the one thousand attempts that might be performed on a non-defective primary column. This reduces the time required to verify a defective column.

Numerous modifications and variations of the present invention are possible in light of the above teachings. It is therefore to be understood that within the scope of the appended claims, the invention may be practiced otherwise than as specifically described herein.

The invention claimed is:

1. A preconditioning method in a flash memory device comprising a plurality of columns, each defective column of the plurality of columns having a corresponding redundant column, the method comprising:
    preprogramming at least one defective column and its corresponding redundant column;
    verifying that the at least one defective column has been preprogrammed; and
    performing an erase operation on the plurality of columns and any corresponding redundant columns.

2. The method of claim 1 and further including performing a $V_t$ tightening operation on the defective primary column.

3. The method of claim 1 wherein the defective primary column is over-erased.

4. The method of claim 1 wherein preprogramming comprises selecting the at least one defective column and its corresponding redundant column and programming memory cells in each column.

5. The method of claim 1 wherein preprogramming comprises writing a logical 0 to each cell in both the at least one defective column and its corresponding redundant column.

6. The method of claim 1 and further including receiving an erase command from a control circuit coupled to the memory device.

7. The method of claim 1 wherein the memory device is a synchronous flash memory device.

8. A method for preconditioning a synchronous flash memory device comprising a plurality of primary memory columns and a plurality of redundant memory columns, the method comprising:
    determining a first defective primary memory column;
    mapping a first redundant memory column to the first defective primary memory column;
    receiving an erase command;
    preprogramming both the first defective primary memory column and the first redundant memory column;
    verifying that the first defective primary memory column has been preprogrammed; and
    performing an erase operation on at least a portion of the flash memory device.

9. The method of claim 8 wherein performing the erase operation comprises erasing a memory block of the device.

10. The method of claim 8 wherein performing the erase operation comprises erasing the plurality of primary memory columns and any corresponding redundant memory columns.

11. The method of claim 10 wherein the verifying is performed a predetermined number of times that is at least one order of magnitude less than the verifying performed on a non-defective column.

12. The method of claim 10 wherein the verifying is performed a predetermined number of times that is at least two orders of magnitude less than the verifying performed on a non-defective column.

13. The method of claim 8 wherein the first defective primary memory column is over-erased.

14. A non-volatile memory device comprising:
    a memory array having a plurality of memory array columns;
    a redundant column area having a plurality of redundant columns, a first redundant column being mapped to a first defective primary column; and
    a controller that performs memory functions of the memory device, the controller adapted to perform a preconditioning function such that the controller preprograms the first redundant column and the first defective primary column, verifies that the first defective primary column has been preprogrammed, and performs an erase operation on at least a portion of the memory array containing the first redundant column and the first defective primary column.

15. The memory device of claim 14 wherein the controller comprises a state machine that executes the erase function.

16. The memory device of claim 14 wherein the controller is further adapted to perform a $V_t$ tightening operation.

17. The memory device of claim 14 wherein the controller is further capable of verifying, a predetermined number of times, that the first memory array column has been preprogrammed.

18. The memory device of claim 14 wherein the controller is further adapted to determine which memory array columns are defective.

19. The memory device of claim 18 wherein the controller is further adapted to determine that the defective memory array column comprises an over-erased cell.

20. The memory device of claim 14 wherein the controller is further adapted to verify, a predetermined number of times that is less than two orders of magnitude less than the verifying performed on a non-defective column, that the first memory array column has been preprogrammed.

* * * * *